United States Patent
Chen et al.

(10) Patent No.: US 9,876,485 B2
(45) Date of Patent: Jan. 23, 2018

(54) ACTIVE CIRCUIT CAPABLE OF PREVENTING IMPEDANCE FROM BEING MISMATCHED IN A BYPASS MODE

(71) Applicant: RichWave Technology Corp., Taipei (TW)

(72) Inventors: Chih-Sheng Chen, Taipei (TW); Ching-Wen Hsu, Taipei (TW); Chien-Yu Li, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/201,520

(22) Filed: Jul. 4, 2016

(65) Prior Publication Data

US 2017/0272059 A1    Sep. 21, 2017

(30) Foreign Application Priority Data

Mar. 18, 2016   (TW) .............................. 105108374 A

(51) Int. Cl.
  *H03K 17/16*    (2006.01)
  *H03K 17/30*    (2006.01)
  *H03K 3/012*    (2006.01)

(52) U.S. Cl.
  CPC ............. *H03K 3/012* (2013.01); *H03K 17/16* (2013.01)

(58) Field of Classification Search
  CPC .................................................... H03K 3/012
  USPC .......................................... 327/379; 330/302
  See application file for complete search history.

(56) References Cited

U.S. PATENT DOCUMENTS

| | | | |
|---|---|---|---|
| 6,768,377 B2 | 7/2004 | Macedo | |
| 7,382,186 B2* | 6/2008 | Apel | H03F 1/0277 330/124 R |
| 7,710,189 B2* | 5/2010 | Toda | H03K 17/162 327/427 |

FOREIGN PATENT DOCUMENTS

| | | |
|---|---|---|
| JP | 2016504004 A | 2/2016 |
| KR | 100455590 B1 | 12/2004 |
| KR | 1020120049341 A | 5/2012 |
| KR | 1020120093357 A | 8/2012 |
| KR | 1020150128650 A | 11/2015 |

OTHER PUBLICATIONS

Sushmit Goswami, Helen Kim, and Joel L. Dawson."A frequency-agile RF frontend architecture for multi-band TDD applications." IEEE Journal of Solid-State Circuits, vol. 49, No. 10, Oct. 2014, 2014 IEEE: pp. 2127-2140.

* cited by examiner

*Primary Examiner* — Lincoln Donovan
*Assistant Examiner* — Metasebia Retebo
(74) *Attorney, Agent, or Firm* — Winston Hsu

(57) ABSTRACT

An active circuit includes an active element, an input unit, and a bypass unit. The active element is coupled to an output terminal of the active circuit for outputting an output signal. The input unit is coupled to an input terminal of the active circuit, and is coupled to an input terminal of the active element through a node. The input unit adjusts a capacitance value of the input unit according to a first control signal. The bypass unit is coupled to an output terminal of the input unit through the node, and is coupled to the output terminal of the active circuit. The bypass unit turns on or off a signal bypassing path according to a second control signal.

22 Claims, 4 Drawing Sheets

ACTIVE CIRCUIT CAPABLE OF PREVENTING IMPEDANCE FROM BEING MISMATCHED IN A BYPASS MODE

CROSS REFERENCE TO RELATED APPLICATION

This application claims priority of Taiwan application No. 105108374, which was filed on Mar. 18, 2016, and is included herein by reference.

TECHNICAL FIELD

This invention is related to an active circuit, and more particularly, an active circuit capable of preventing impedance from being mismatched in a bypass mode.

BACKGROUND

The active circuit is usually used to improve quality or intensity of signals outputted from the circuit of prior stage before the signals are passed to the circuit of next stage. However, in some applications, for example, when the active circuit is quite close to the signal source, the quality or intensity of the signals received by the active circuit may be already good enough for the circuit of next stage. In this case, to avoid unnecessary power consumption, the active circuit may enable the bypass mode, and may output the received signals directly through the bypassing path of the active circuit. Consequently, the active element of the active circuit can be disabled, and the power consumption can be reduced.

However, since the impedance of the active element was designed to be matched with the signal path during the active mode, the loading effect of the active element may cause the impedance to be no longer matched to the single path. This deteriorates the quality or the intensity of the output signals when the bypass mode is enabled and the active element is disabled. Therefore, it is necessary to design an active circuit that is able to prevent the impedance from being mismatched with the signal path in a bypass mode so as to avoid deteriorating the quality or the intensity of the output signals.

SUMMARY

One embodiment of the present invention discloses an active circuit. The active circuit includes an active element, an input unit, and a bypass unit.

The active element has an input terminal, and an output terminal coupled to an output terminal of the active circuit, and the output terminal of the active element outputs an output signal. The input unit adjusts a capacitance value of the input unit according to a first control signal. The input unit includes an input terminal, an output terminal, and a first switch. The input terminal is coupled to an input terminal of the active circuit. The output terminal is coupled to the input terminal of the active element through a node. The first switch has a first terminal, a second terminal, and a control terminal for receiving the first control signal.

The bypass unit turns on or off a signal bypassing path according to a second control signal. The bypass unit includes an input terminal, an output terminal, and a second switch. The input terminal is coupled to the output terminal of the input unit through the node. The output terminal is coupled to the output terminal of the active circuit. The second switch has a first terminal, a second terminal, and a control terminal configured to receive the second control signal.

Another embodiment of the present invention discloses an active circuit. The active circuit includes an active element, an input unit, a bypass unit, and a third switch.

The active element has an input terminal, and an output terminal for outputting an output signal. The input unit adjusts a capacitance value of the input unit according to a first control signal. The input unit includes an input terminal, an output terminal, and a first switch. The input terminal is coupled to an input terminal of the active circuit. The output terminal is coupled to the input terminal of the active element through a node. The first switch has a first terminal, a second terminal, and a control terminal for receiving the first control signal.

The bypass unit is coupled between the output terminal of the input unit and an output terminal of the active circuit, and the bypass unit turns on or off a signal bypassing path according to a second control signal. The bypass unit includes an input terminal, an output terminal, and a second switch. The input terminal is coupled to the output terminal of the input unit through the node. The output terminal is coupled to the output terminal of the active circuit. The second switch has a first terminal, a second terminal, and a control terminal configured to receive the second control signal.

The third switch is coupled between the output terminal of the active element and the output terminal of the active circuit. The third switch has a first terminal coupled to the output terminal of the active element, a second terminal coupled to the output terminal of the active circuit, and a control terminal for receiving a third control signal. The size of the first switch is greater than the size of the second switch, and the size of the first switch is greater than the size of the third switch.

DETAILED DESCRIPTION

Figure 1:
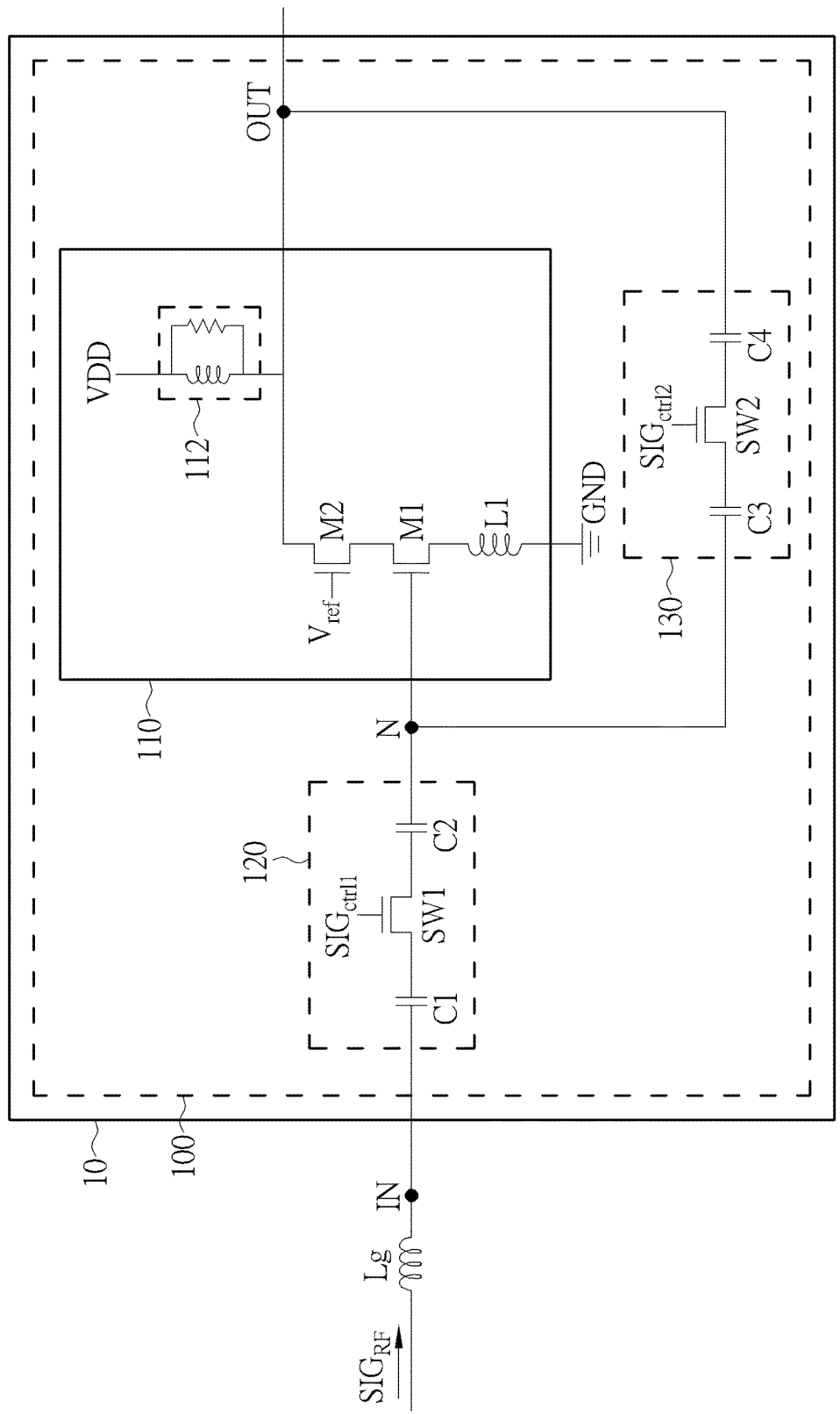
FIG. 1 shows an active circuit according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows an active circuit 100 according to one embodiment of the present invention. The active circuit 100 includes an active element 110, an input unit 120 and a bypass unit 130.

In the embodiment of FIG. 1, the active circuit 100 can be used as a radio frequency signal receiver, and the active element 110 can be a low noise amplifier for amplifying the radio frequency signal $SIG_{RF}$. In the present embodiment, the active circuit 100 in FIG. 1 can receive the radio frequency signal $SIG_{RF}$ from the inductor $L_g$. The inductance value of the inductor $L_g$ can be designed to be matched with the impedance of the active element 110 so that the signal reflection can be reduced and the active element 110 can amplify the radio frequency signal $SIG_{RF}$ in the active mode of the active circuit 100. In some embodiments of the present invention, the active circuit 100 can be disposed in the chip 10, and the inductor $L_g$ can be disposed outside of the chip 10 and can be coupled to the input terminal IN of the active circuit 100.

The active element 110 includes an input terminal and an output terminal. The output terminal of the active element 110 is coupled to the output terminal OUT of the active circuit 100, and the output terminal of the active element 110 can output an output signal. In this embodiment, the active element 110 can include a first transistor M1, a second transistor M2, an inductor L1, and a matching circuit 112.

The first transistor M1 has a first terminal, a second terminal, and a control terminal. The control terminal of the first transistor M1 is coupled to the input terminal of the active element 110. The second transistor M2 has a first terminal, a second terminal, and a control terminal. The first terminal of the second transistor M2 is coupled to the output terminal of the active element 110, the second terminal of the second transistor M2 is coupled to the first terminal of the first transistor M1, and the control terminal of the second transistor M2 receives the reference voltage $V_{ref}$. The inductor L1 is coupled between the second terminal of the first transistor M1 and a ground terminal GND. The inductor L1 has a first terminal and a second terminal. The first terminal of the inductor L1 is coupled to the second terminal of the first transistor M1, and the second terminal of the inductor L1 is coupled to the ground terminal GND. The matching circuit 112 has a first terminal and a second terminal. The first terminal of the matching circuit 112 receives the system voltage VDD, and the second terminal of the matching circuit 112 is coupled to the first terminal of the second transistor M2. The active element 110 can adjust the required impedance of the active element 110 by adjusting the passive elements of the matching circuit 112, such as the inductor and/or resistor in the matching circuit 112. In some embodiments of the present invention, if the system voltage VDD is 1.8V to 3.3V, then the reference voltage $V_{ref}$ can be 1.5V to 3.3V.

In addition, in some embodiments of the present invention, the active element 110 can be power amplifier, mixer or other active elements according to the system requirement and the function of the active circuit 100.

The input unit 120 has an input terminal and an output terminal. The input terminal of the input unit 120 is coupled to the input terminal IN of the active circuit 100, and the output terminal of the input unit 120 is coupled to the input terminal of the active element 110 through the node N. The input unit 120 can adjust the capacitance value of the input unit 120 according to a first control signal $SIG_{ctrl1}$. The input unit 120 includes a first switch SW1. The first switch SW1 has a first terminal, a second terminal, and a control terminal. The control terminal of the first switch SW1 receives the first control signal $SIG_{ctrl1}$.

The bypass unit 130 has an input terminal and an output terminal. The input terminal of the bypass unit 130 is coupled to the output terminal of the input unit 120 through the node N, and the output terminal of the bypass unit 130 is coupled to the output terminal OUT of the active circuit 100. The bypass unit 130 can turn on or off a signal bypassing path according to a second control signal $SIG_{ctrl2}$.

The signal bypassing path can be formed by the signal path from the node N through the bypass unit 130 to the output terminal OUT of the active circuit 100. The bypass unit 130 includes a second switch SW2. The second switch SW2 has a first terminal, a second terminal, and a control terminal. The control terminal of the second switch SW2 can receive the second control signal $SIG_{ctrl2}$. In some embodiments of the present invention, the first switch SW1 and the second switch SW2 can both be metal-oxide-semiconductor field-effect transistors.

In the active mode of the active circuit 100, the first control signal $SIG_{ctrl1}$ can turn on the first switch SW1, and the second control signal $SIG_{ctrl2}$ can turn off the second switch SW2. In this case, the active element 110 can amplify the radio frequency signal $SIG_{RF}$. In the bypass mode of the active circuit 100, the first control signal $SIG_{ctrl2}$ can turn off the first switch SW1 so as to make the first switch SW1 become an equivalent capacitor $C_e$, and the second control signal $SIG_{ctrl2}$ can turn on the second switch SW2. In this case, the radio frequency signal $SIG_{RF}$ can be outputted to the output terminal OUT of the active circuit 100 through the bypass unit 130 directly without passing through the active element 110 while the equivalent capacitor $C_e$ can compensate the loading effect caused by the active element 110.

That is, in the bypass mode of the active circuit 100, the first switch SW1 is turned off, and the second switch SW2 is turned on. In this case, the gate-source capacitor of the first transistor M1 in the active element 110 may cause the loading effect. However, because the first switch SW1 is turned off and becomes the equivalent capacitor $C_e$, the imaginary impedance of the equivalent capacitor $C_e$ and the inductor $L_g$ may cancel each other, which reduces the loading effect caused by the gate-source capacitor of the first transistor M1. For example, if the inductance value of the inductor $L_g$ is L, then the impedance of the inductor $L_g$ can be represented as $j\omega L$, where j represents the imaginary part. Also, if the capacitance value of the equivalent capacitor $C_e$ is C, then the impedance of the $C_e$ can be represented as $$\frac{1}{j\omega C}.$$

In this case, without considering other capacitors on the signal path, the impedance at the node N after the radio frequency signal $SIG_{RF}$ passing through the inductor $L_g$ and the equivalent capacitor $C_e$ can be represented as $$j\omega L + \frac{1}{j\omega C}.$$

Therefore, by selecting the size of the first switch SW1 properly according to the frequency of the radio frequency signal $SIG_{RF}$, the equivalent capacitor $C_e$ and the inductor $L_g$ can be matched with each other so that the imaginary impedance of the node N in the bypass mode of the active circuit 100 can be canceled. In addition, since the input terminal of the bypass unit 130 is coupled to the output terminal of the input unit 120 through the node N, the loading effect on the bypass unit 130 caused by the first transistor M1 can be reduced due to the cancellation of the imaginary impedance of the equivalent capacitor $C_e$ and the inductor $L_g$.

In other words, the active circuit 100 can cancel the imaginary impedance of the external inductor $L_g$ by the equivalent capacitor $C_e$ of the turned-off first switch SW1 in the bypass mode, which also reduces the loading effect on the active circuit 100 caused by the first transistor M1. Therefore, the radio frequency signal $SIG_{RF}$ can pass through the bypass unit 130 smoothly to the output terminal OUT of the active circuit 100.

In addition, in the embodiment of FIG. 1, the input unit 120 may further include a first capacitor C1 and a second capacitor C2 for isolating the direct current of the received signal. The first capacitor C1 has a first terminal and a second terminal. The first terminal of the first capacitor C1 is coupled to the input terminal IN of the active circuit 100, and the second terminal of the first capacitor C1 is coupled to the first terminal of the first switch SW1. The second capacitor C2 has a first terminal and a second terminal. The first terminal of the second capacitor C2 is coupled to the second terminal of the first switch SW1, and the second terminal of the second capacitor C2 is coupled to the input terminal of the active element 110 through the node N. However, in some embodiments, the input unit 120 may not include the first capacitor C1 and the second capacitor C2, or the input unit 120 may only include the first capacitor C1 or only include the second capacitor C2.

Similarly, the bypass unit 130 may also include a third capacitor C3 and a fourth capacitor C4 for isolating the direct current of the received signal. The third capacitor C3 has a first terminal and a second terminal. The first terminal of the third capacitor C3 is coupled to the input terminal of the active element 110, and the second terminal of the third capacitor C3 is coupled to the first terminal of the second switch SW2. The fourth capacitor C4 has a first terminal and a second terminal. The first terminal of the fourth capacitor C4 is coupled to the second terminal of the second switch SW2, and the second terminal of the fourth capacitor C4 is coupled to the output terminal OUT of the active circuit 100. In some embodiments, the bypass unit 130 may not include the third capacitor C3 and the fourth capacitor C4, or the bypass unit 130 may only include the third capacitor C3 or only include the fourth capacitor C4.

In some embodiments of the present invention, when the size of the first switch is properly selected, the characteristic of the active circuit 100 in the active mode, such as the noise figure or the required chip area of the active circuit 100, may also be changed. Therefore, a decision for a trade-off can be necessary. To provide more selections for the size of the first switch SW1, the active circuit 100 may further include other matching capacitors in some embodiments.

Figure 2:
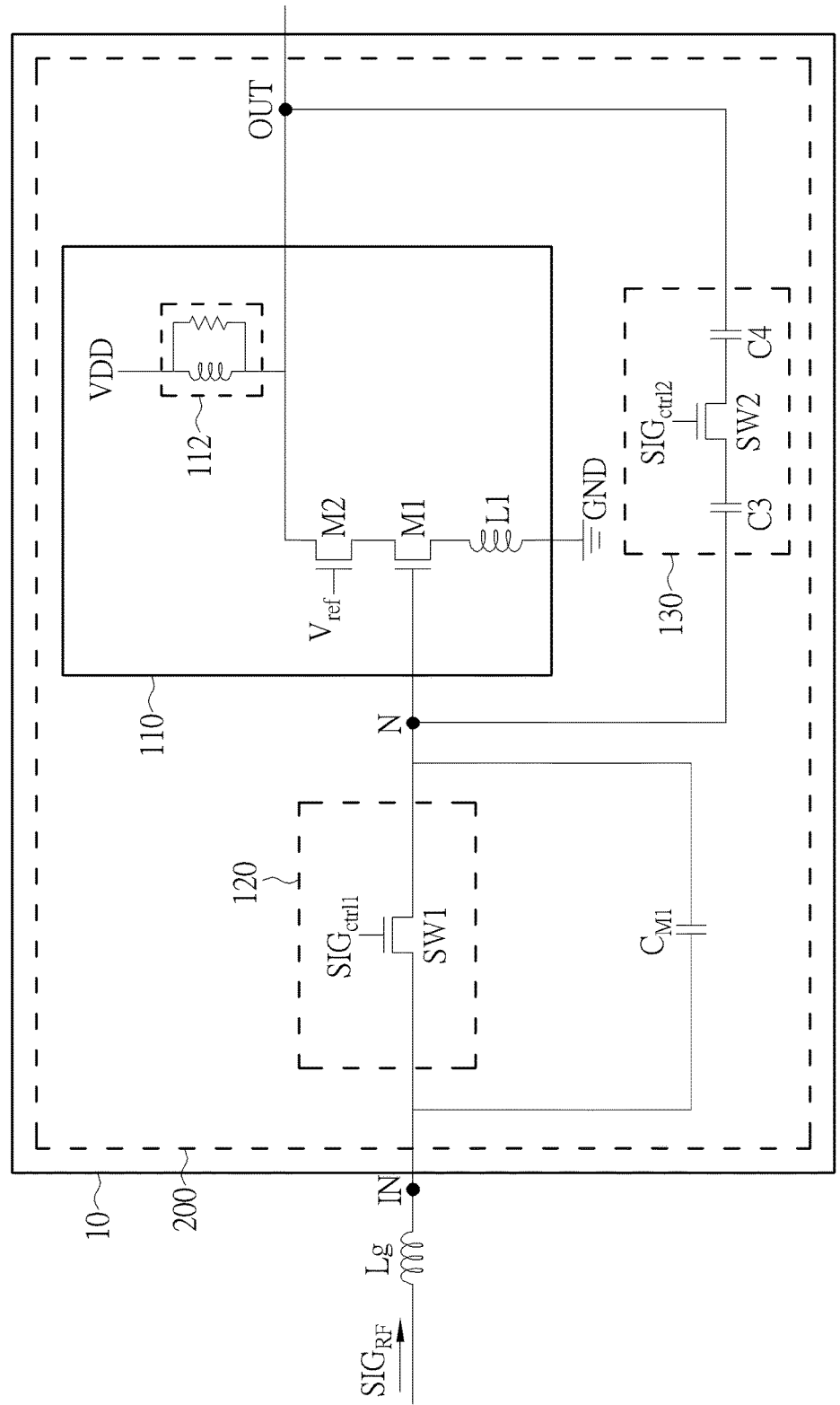
FIG. 2 shows an active circuit according to another embodiment of the present invention.

FIG. 2 shows an active circuit 200 according to one embodiment of the present invention. The active circuit 200 and the active circuit 100 have the similar structures and similar operation principles. The main difference between these two active circuits is in that the active circuit 200 further includes a matching capacitor $C_{M1}$ coupled to the input unit 120 in parallel. The matching capacitor $C_{M1}$ has a first terminal and a second terminal. The first terminal of the matching capacitor $C_{M1}$ is coupled to the input terminal IN of the active circuit 100, and the second terminal of the matching capacitor $C_{M1}$ is coupled to the bypass unit 130 through the node N. Since the matching capacitor $C_{M1}$ is coupled to the input unit 120 in parallel, the matching capacitor $C_{M1}$ and the equivalent capacitor $C_e$ of the first switch SW1 can together be used to cancel the imaginary impedance of the external inductor $L_g$ in the bypass mode of the active circuit 200. For example, if the frequency of the radio frequency signal $SIG_{RF}$ is in the range between 2.6 GHz and 2.7 GHz, the inductance value of the inductor $L_g$ is 8.2 nH, the capacitance values of the third capacitor C3 and the fourth capacitor C4 are both 10 pF, and the capacitance value of the gate-source capacitor of the first transistor M1 is 0.2 pF, then the first switch SW1 with equivalent capacitor $C_e$ having capacitance value as 0.4 pF and the matching capacitor $C_{M1}$ having capacitance value as 40 fF may be selected. In this case, the matching capacitor $C_{M1}$ and the first switch SW1 coupled in parallel can be used to cancel the imaginary impedance of the external inductor $L_g$.

Figure 3:
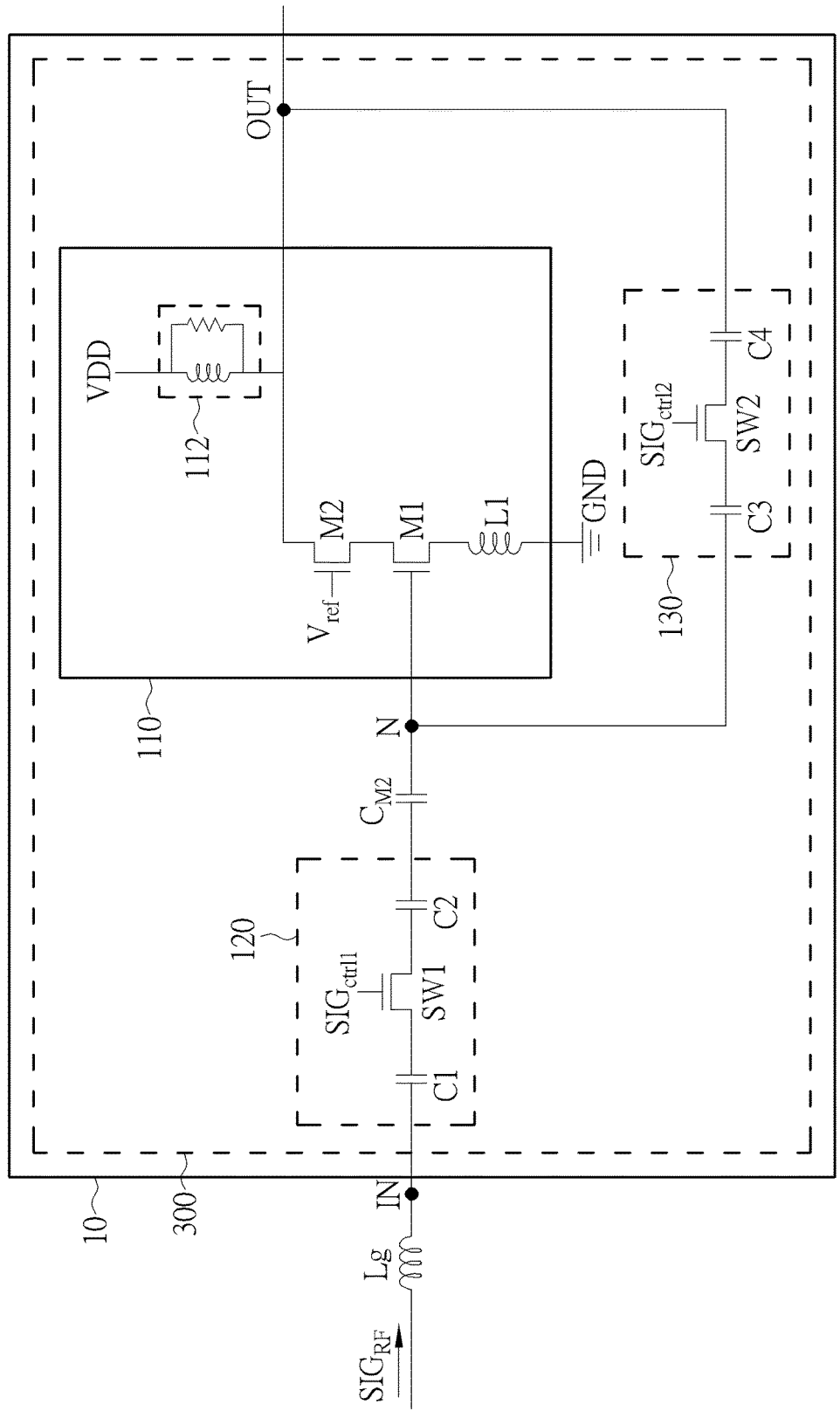
FIG. 3 shows an active circuit according to another embodiment of the present invention.

FIG. 3 shows an active circuit 300 according to one embodiment of the present invention. The active circuit 300 and the active circuit 100 have similar structures and operation principles. The main difference between these two active circuits is in that the active circuit 300 further includes a matching capacitor $C_{M2}$. The matching capacitor $C_{M2}$ and the input unit 120 are coupled in series, and the matching capacitor $C_{M2}$ is coupled to the bypass unit 130 through the node N. That is, the matching capacitor $C_{M2}$ is coupled between the input unit 120 and the bypass unit 130. By selecting the matching capacitor $C_{M2}$ properly, the matching capacitor $C_{M2}$ and the first switch SW1 coupled in series can together cancel the imaginary impedance of the external inductor $L_g$. In other words, with the matching capacitor $C_{M1}$ of the active circuit 200 and/or the matching capacitor $C_{M2}$ of the active circuit 300, the user can choose the size of the first switch SW1 with more flexibility while the loading effect of the first transistor M1 can still be reduced preventing the quality and the intensity of the signals from being deteriorated. In some other embodiments, the matching capacitor $C_{M2}$ can also be coupled in series between the input terminal IN of the active circuit 100 and the input terminal of the input unit 120.

In addition, in the active circuit 300, when the matching capacitor $C_{M2}$ is coupled in series with the input unit 120, the matching capacitor $C_{M2}$ can also be disposed outside of the active circuit 300 as the inductor $L_g$ or even outside of the chip 10.

Figure 4:
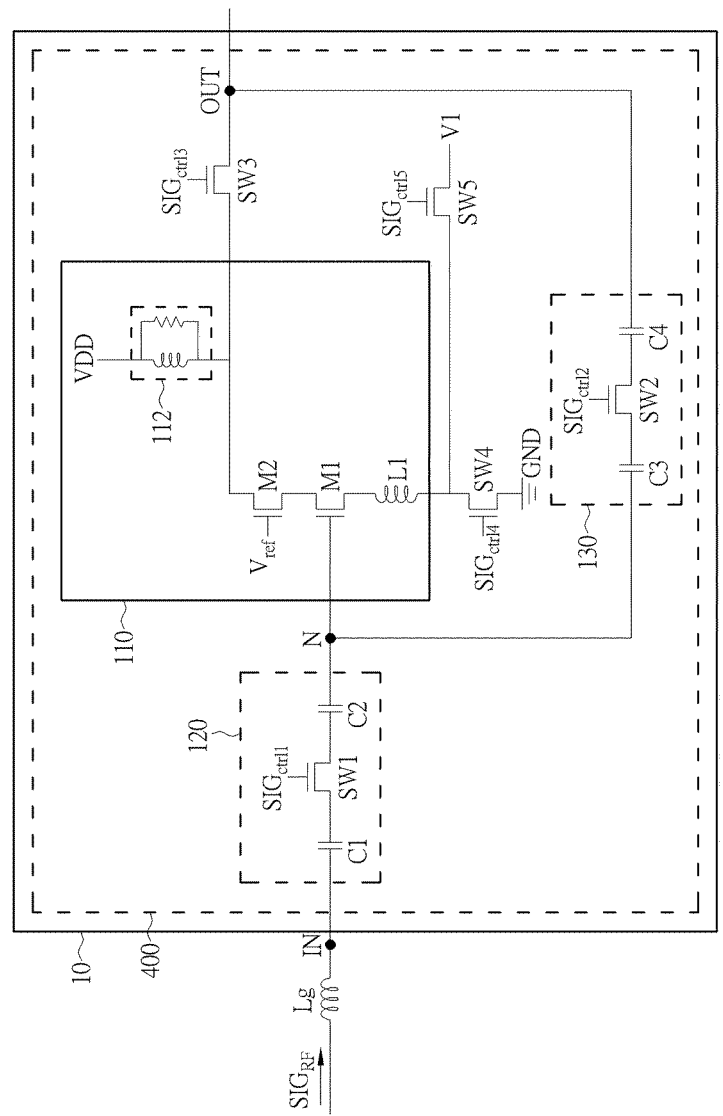
FIG. 4 shows an active circuit according to another embodiment of the present invention.

FIG. 4 shows an active circuit 400 according to one embodiment of the present invention. The active circuit 400 and the active circuit 100 have similar structures and operation principles. One of the main differences between these two active circuits is in that the active circuit 400 further includes a switch SW3. The third switch SW3 is coupled between the active element 110 and the output terminal OUT of the active circuit 400. The third switch SW3 has a first terminal, a second terminal, and a control terminal. The first terminal of the third switch SW3 is coupled to the output terminal of the active element 110, the second terminal of the third switch SW3 is coupled to the output terminal OUT of the active circuit 400, and the control terminal of the third switch SW3 receives the third control signal $SIG_{ctrl3}$.

In the active mode of the active circuit 400, the third control signal $SIG_{ctrl3}$ can turn on the third switch SW3 so that the radio frequency signal $SIG_{RF}$ can be outputted to the output terminal OUT of the active circuit 400 through the active element 110. In the bypass mode of the active circuit 400, the third control signal $SIG_{ctrl3}$ can turn off the third switch so that the radio frequency signal $SIG_{ctrl3}$ outputted from the bypass unit 130 will not flow back to the active element 110 preventing the active element 110 from performing unexpected operations.

In some embodiments, to make the equivalent capacitor $C_e$ of the first switch SW1 cancel the imaginary impedance of the inductor $L_g$, the size of the first switch SW1 can be greater than the size of the second switch SW2, and the size of the first switch SW1 can be greater than the third switch SW3. However, in some embodiments of the present invention, the active circuit 400 can further include the matching capacitor $C_{M1}$ of the active circuit 200 and/or the matching capacitor $C_{M2}$ of the active circuit 300.

In addition, another main difference between the active circuit 400 and the active circuit 100 is in that the active circuit 400 further includes a fourth switch SW4. To prevent the first transistor M1 of the active element 110 from being turned on unintentionally due to the over swing of the radio frequency signal $SIG_{RF}$, the active circuit 400 may further include the fourth switch SW4. The fourth switch SW4 is coupled between the first transistor M1 of the active element 110 and the ground terminal GND. The fourth switch SW4 has a first terminal, a second terminal, and a control terminal. The first terminal of the fourth switch SW4 is coupled to the second terminal of the first transistor M1, the second terminal of the fourth switch SW4 is coupled to the ground terminal GND, and the control terminal of the fourth switch SW4 is coupled to the fourth control signal $SIG_{ctrl4}$. In the active mode of the active circuit 400, the fourth control signal $SIG_{ctrl4}$ can turn on the fourth switch SW4, and in the bypass mode of the active circuit 400, the fourth control signal $SIG_{ctrl4}$ can turn off the fourth switch SW4. By turning off the fourth switch SW4 with the fourth control signal $SIG_{ctrl4}$, the first transistor M1 may no longer be turned on unintentionally by the over swing of the radio frequency signal $SIG_{RF}$.

Moreover, to further ensure that the fourth switch SW4 can be turned off, the active circuit 400 can use a fifth switch SW5 to keep the first terminal of the fourth switch SW4 at a fixed first voltage V1, such as 1.55V, to prevent the fourth switch SW4 from being turned on unexpectedly.

The fifth switch SW5 has a first terminal, a second terminal, and a control terminal. The first terminal of the fifth switch SW5 receives the first voltage V1, the second terminal of the fifth switch SW5 is coupled to the first terminal of the fourth switch SW4 and the second terminal of the first transistor M1 of the active element 110, and the control terminal of the fifth switch SW5 receives the fifth control signal $SIG_{ctrl5}$. In the active mode of the active circuit 400, the fifth control signal $SIG_{ctrl5}$ can turn off the fifth switch SW5, and in the bypass mode of the active circuit 400, the fifth control signal $SIG_{ctrl5}$ can turn on the fifth switch SW5. Consequently, in the bypass mode, the first terminal of the fourth switch SW4 would be kept at the first voltage V1, which is higher than the voltage of the first terminal of the fourth switch SW4 in the active mode, preventing the fourth switch SW4 from being turned on by the radio frequency signal $SIG_{RF}$.

In summary, the active circuits provided by the embodiments of the present invention can use the equivalent capacitor of the turned-off switch to compensate the imaginary impedance on the signal path in the bypass mode so that the impedance encountered by the radio frequency signal before entering the bypass unit or the active element can be reduced effectively. Consequently, the loading effect can be reduced, and the intensity and the quality of the active circuit can be preserved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An active circuit comprising:
    an active element having an input terminal, and an output terminal coupled to an output terminal of the active circuit, and the output terminal of the active element configured to output an output signal;
    an input unit configured to adjust a capacitance value of the input unit according to a first control signal, the input unit comprising:
        an input terminal coupled to an input terminal of the active circuit;
        an output terminal coupled to the input terminal of the active element through a node; and
        a first switch having a first terminal, a second terminal, and a control terminal configured to receive the first control signal; and
    a bypass unit configured to turn on or off a signal bypassing path according to a second control signal, the bypass unit comprising:
        an input terminal coupled to the output terminal of the input unit through the node;
        an output terminal coupled to the output terminal of the active circuit; and
        a second switch having a first terminal, a second terminal, and a control terminal configured to receive the second control signal;
    wherein the active element and the bypass unit are coupled in parallel between the node and the output terminal of the active circuit.

2. The active circuit of claim 1, wherein:
    in an active mode of the active circuit, the first control signal turns on the first switch, and the second control signal turns off the second switch; and
    in a bypass mode of the active circuit, the first control signal turns off the first switch so as to make the first switch become an equivalent capacitor, and the second control signal turns on the second switch.

3. The active circuit of claim 1, wherein the input unit further comprises:
    a first capacitor having a first terminal coupled to the input terminal of the active circuit, and a second terminal coupled to the first terminal of the first switch; and
    a second capacitor having a first terminal coupled to the second terminal of the first switch, and a second terminal coupled to the input terminal of the active element through the node.

4. The active circuit of claim 1, wherein the bypass unit further comprises:
    a third capacitor having a first terminal coupled to the input terminal of the active element, and a second terminal coupled to the first terminal of the second switch; and
    a fourth capacitor having a first terminal coupled to the second terminal of the second switch, and a second terminal coupled to the output terminal of the active circuit.

5. The active circuit of claim 1, further comprising:
    a matching capacitor coupled to the input unit in parallel.

6. The active circuit of claim 1, further comprising:
    a matching capacitor coupled to the input unit and the bypass unit in series and between the input unit and the bypass unit.

7. The active circuit of claim 1, wherein the active element comprises
    a low noise amplifier, a power amplifier, or a mixer.

8. The active circuit of claim 1, wherein the active element comprises:
    a first transistor having a first terminal, a second terminal, and a control terminal coupled to the input terminal of the active element; and a second transistor having a first terminal coupled to the output terminal of the active element, a second terminal coupled to the first terminal of the first transistor, and a control terminal configured to receive a reference voltage.

9. The active circuit of claim 8, wherein the active element further comprises:
an inductor coupled between the second terminal of the first transistor and a ground terminal, the inductor having a first terminal coupled to the second terminal of the first transistor, and a second terminal coupled to the ground terminal; and
a matching circuit coupled to the first terminal of the second transistor.

10. The active circuit of claim 8, further comprising:
a fourth switch coupled between the first transistor of the active element and a ground terminal, the fourth switch having a first terminal coupled to the second terminal of the first transistor, a second terminal coupled to the ground terminal, and a control terminal configured to receive a fourth control signal.

11. The active circuit of claim 10, wherein:
in an active mode of the active circuit, the fourth control signal turns on the fourth switch; and
in a bypass mode of the active circuit, the fourth control signal turns off the fourth switch.

12. The active circuit of claim 10, further comprising:
a fifth switch having a first terminal configured to receive a first voltage, a second terminal coupled to the first terminal of the fourth switch and the second terminal of the first transistor of the active element, and a control terminal configured to receive a fifth control signal.

13. The active circuit of claim 12, wherein:
in an active mode of the active circuit, the fifth control signal turns off the fifth switch; and
in a bypass mode of the active circuit, the fifth control signal turns on the fifth switch.

14. The active circuit of claim 1, further comprising:
a third switch coupled between the active element and the output terminal of the active circuit, the third switch having a first terminal coupled to the output terminal of the active element, a second terminal coupled to the output terminal of the active circuit, and a control terminal configured to receive a third control signal.

15. The active circuit of claim 14, wherein:
in an active mode of the active circuit, the third control signal turns on the third switch; and
in a bypass mode of the active circuit, the third control signal turns off the third switch.

16. The active circuit of claim 1, wherein the active circuit is disposed inside a chip, and the output terminal of the active circuit is coupled to an inductor outside of the chip.

17. An active circuit comprising:
an active element having an input terminal, and an output terminal configured to output an output signal;
an input unit configured to adjust a capacitance value of the input unit according to a first control signal, the input unit comprising:
an input terminal coupled to an input terminal of the active circuit;
an output terminal coupled to the input terminal of the active element through a node; and
a first switch having a first terminal, a second terminal, and a control terminal configured to receive the first control signal;
a bypass unit coupled between the output terminal of the input unit and an output terminal of the active circuit, and configured to turn on or off a signal bypassing path according to a second control signal, the bypass unit comprising:
an input terminal coupled to the output terminal of the input unit through the node;
an output terminal coupled to the output terminal of the active circuit; and
a second switch having a first terminal, a second terminal, and a control terminal configured to receive the second control signal; and
a third switch coupled between the output terminal of the active element and the output terminal of the active circuit, the third switch having a first terminal coupled to the output terminal of the active element, a second terminal coupled to the output terminal of the active circuit, and a control terminal configured to receive a third control signal;
wherein a size of the first switch is greater than a size of the second switch, and the size of the first switch is greater than a size of the third switch; and
wherein the active element and the bypass unit are coupled in parallel between the node and the output terminal of the active circuit.

18. The active circuit of claim 17, further comprising:
a fourth switch coupled between the active element and a ground terminal, the fourth switch having a first terminal coupled to the active element, a second terminal coupled to the ground terminal, and a control terminal configured to receive a fourth control signal;
wherein:
in an active mode of the active circuit, the fourth control signal turns on the fourth switch; and
in a bypass mode of the active circuit, the fourth control signal turns off the fourth switch.

19. The active circuit of claim 18, further comprising:
a fifth switch having a first terminal configured to receive a first voltage, a second terminal coupled to the first terminal of the fourth switch and the active element, and a control terminal configured to receive a fifth control signal;
wherein:
in the active mode of the active circuit, the fifth control signal turns off the fifth switch; and
in the bypass mode of the active circuit, the fifth control signal turns on the fifth switch.

20. The active circuit of claim 17, wherein the active element comprises:
a first transistor having a first terminal, a second terminal, and a control terminal coupled to the input terminal of the active element; and
a second transistor having a first terminal coupled to the output terminal of the active element, a second terminal coupled to the first terminal of the first transistor, and a control terminal configured to receive a reference voltage.

21. The active circuit of claim 17, wherein:
the active circuit is configured to receive a radio frequency signal;
in an active mode of the active circuit, the active circuit amplifies the radio frequency signal with the active element; and
in a bypass mode of the active circuit, the active circuit outputs the radio frequency signal through the bypass unit to the output terminal of the active circuit without passing through the active element.

22. The active circuit of claim 1, wherein:
the active circuit is configured to receive a radio frequency signal;
in an active mode of the active circuit, the active circuit amplifies the radio frequency signal with the active element; and
in a bypass mode of the active circuit, the active circuit outputs the radio frequency signal through the bypass unit to the output terminal of the active circuit without passing through the active element.

* * * * *